United States Patent [19]
Jove et al.

[11] Patent Number: 5,270,882
[45] Date of Patent: Dec. 14, 1993

[54] LOW-VOLTAGE, LOW-POWER AMPLIFIER FOR MAGNETORESISTIVE SENSOR

[75] Inventors: Stephen A. Jove, Watsonville; Klaas B. Klaassen; Jacobus C. L. van Peppen, both of San Jose, all of Calif.

[73] Assignee: International Business Machines Corporation, Armonk, N.Y.

[21] Appl. No.: 914,278

[22] Filed: Jul. 15, 1992

[51] Int. Cl.$^5$ .............................................. G11B 5/02
[52] U.S. Cl. ........................................ 360/67; 360/66
[58] Field of Search ................... 360/67, 66, 61, 46, 360/113

[56] References Cited

U.S. PATENT DOCUMENTS

| | | | |
|---|---|---|---|
| 4,218,659 | 8/1980 | Arai | 360/67 |
| 4,492,997 | 1/1985 | Arai et al. | 360/113 |
| 4,706,138 | 11/1987 | Jove et al. | 360/67 |

FOREIGN PATENT DOCUMENTS

0478298A2  9/1991  European Pat. Off.
0296402    5/1988  Japan.

Primary Examiner—Donald Hajec
Assistant Examiner—Jhihan Clark
Attorney, Agent, or Firm—Henry E. Otto, Jr.

[57] ABSTRACT

Low noise, low power, low voltage amplifier circuits with a single ended input having no common mode rejection for concurrently biasing and amplifying signals generated by magnetoresistive (MR) elements in a disk file. The amplifier circuits comprise a single (grounded) supply voltage source. One terminal of each MR element and the conductive substrate of each MR element and the conductive substrate of each disk in the disk file are grounded to minimize transient conductive asperity currents. The head/disk assembly of the disk file is completely enclosed by a highly conductive electrostatically shielded metallic enclosure that operates as a Faraday cage and isolates leads connecting the MR elements with the amplifier circuit from large, fast rise-/fall time voltage transients.

10 Claims, 3 Drawing Sheets

LOW-VOLTAGE, LOW-POWER AMPLIFIER FOR MAGNETORESISTIVE SENSOR

This invention relates to disk storage systems employing amplifiers for (i) amplifying signals from magnetoresistive (MR) sensors to detect a read signal and (ii) biasing and switching said sensors. More particularly, it relates to a low noise amplifier for MR sensors that provides fast read-write switching and can operate with low supply voltages and a single grounded power supply.

BACKGROUND OF THE INVENTION

Amplifiers heretofore used for MR sensors that have had differential inputs and differential outputs were unable to operate with a single power supply voltage of less than five volts due, among other things, to excessive power dissipation. Permalloy magnetoresistive (PMR) amplifiers either require dual power supply voltages with a grounded disk/spindle assembly or require that the disk spindle assembly float at a potential between ground and a single supply voltage. Care must be taken to not short the disk/spindle assembly to ground during manufacture; and the accuracy with which said assembly is biased relative to the potential of the MR sensor is critical, requiring expensive resistor adjusting and/or a dedicated feedback circuit including a capacitor external to an arm electronics (AE) chip.

There is a need for an improved amplification circuit and method for use with MR sensors in low end storage products that has the following desirable features:

(1) A single (grounded) power supply.
(2) Up to 3 dB less noise than differential input amplifiers.
(3) Operability with power supply voltages of five volts or less without requiring an electrically floating disk/spindle assembly.
(4) Reduced power dissipation.
(5) Continuously adjustable read bias current without resistor trimming or noise aggravation.
(6) Fast activation and deactivation to minimize power dissipation between reading of sector servo patterns circumferentially spaced on a recording disk.
(7) Current biased MR sensors with dR/R signal detection, as taught in U.S. Pat. No. 4,706,138, to render the amplifier output signal relatively insensitive to variations in stripe height of the MR sensors.
(8) Use, with a single-ended amplifier, of a disk enclosure as a Faraday cage to enable interference-free amplification of MR sensor signals.

SUMMARY OF THE INVENTION

Low noise, low power, low voltage amplifier circuits with a single ended input having no common mode rejection are disclosed for concurrently biasing and amplifying signals generated by magnetoresistive (MR) elements in a disk file. The amplifier circuits comprise a single (grounded) supply voltage source. One terminal of each MR element and the conductive substrate of each MR element and the conductive substrate of each disk in the disk file are grounded to minimize transient conductive asperity currents. The head/disk assembly of the disk file is completely enclosed by a highly conductive electrostatically shielded metallic enclosure that operates as a Faraday cage and isolates leads connecting the MR elements with the amplifier circuit from large, fast rise/fall time voltage transients.

DESCRIPTION OF THE DRAWINGS

FIGS. 3A, 3B, and 3C are perspective views of the complete shielding disk enclosure as viewed from the top, of the enclosure with upper cover removed, and of the under side of the enclosure, respectively.

DESCRIPTION OF PREFERRED EMBODIMENT

Figure 1:
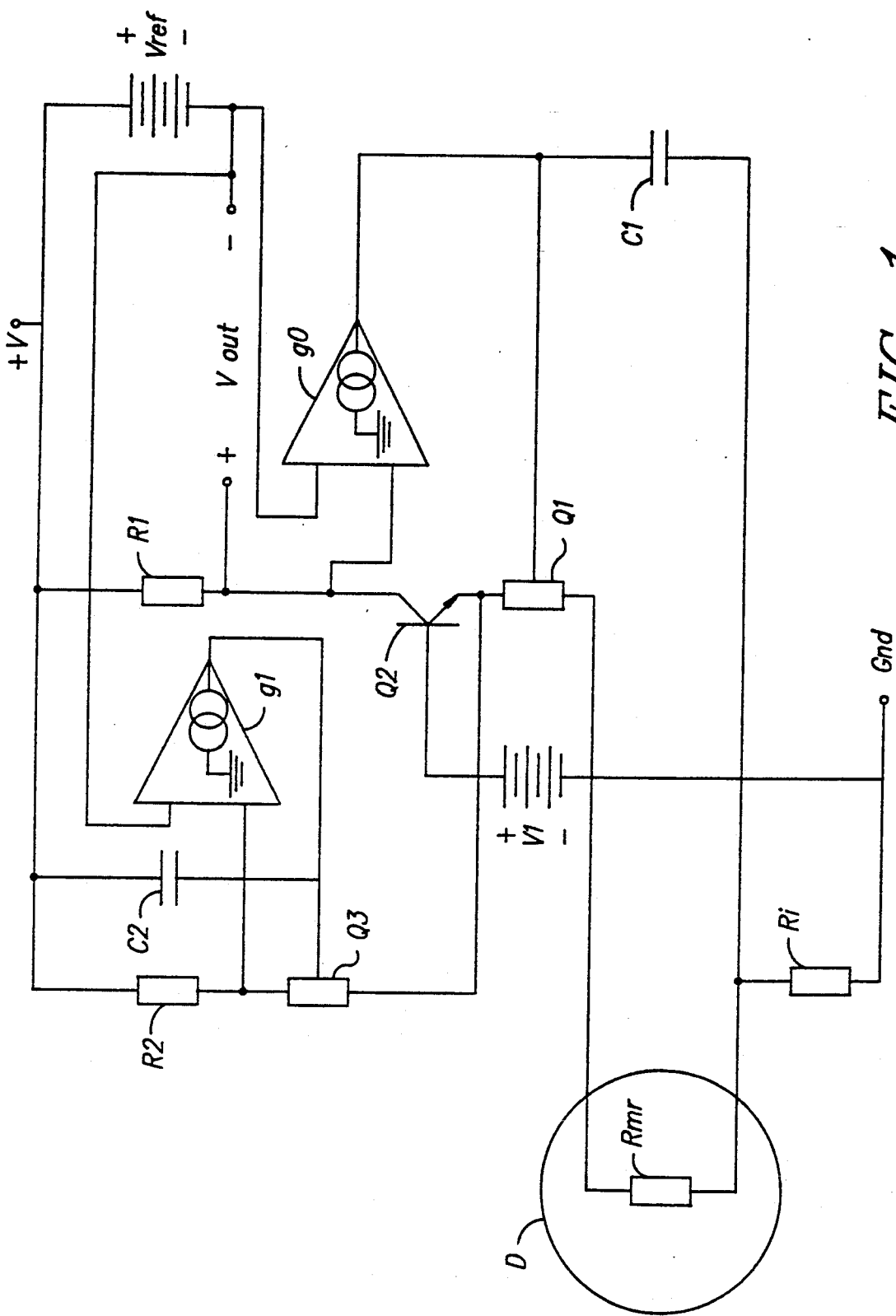
FIG. 1 is a schematic diagram of an amplifier circuit according to one embodiment of the invention for amplifying signals from a magnetoresistive element without common mode rejection contained within a disk enclosure that serves as a shielding Faraday cage.

As illustrated in FIG. 1, the amplifier circuit comprises a magnetoresistive (MR) element Rmr which senses binary data from a magnetic recording disk D, a resistor R1 for setting gain of the circuit, a single supply voltage source $+V$ and a reference voltage source Vref referenced to said supply voltage $+V$.

A semiconductor element Q1, which constitutes the active input device for the amplifier circuit, may be an NPN bipolar transistor (or, if preferred, an enhancement mode NFET). The emitter (or source) of Q1 supplies a bias current to MR element Rmr. One end of resistor R1 is connected to supply voltage source $+V$. The other end of R1 is connected to the collector (or drain) of semiconductor element Q1 (by way of transistor Q2 if used for reasons hereinafter stated) to develop an output signal voltage. This output signal voltage corresponds to an amplified version of the input signal current developed by MR element Rmr while being concurrently biased with the biasing current from Q1 in the presence of magnetic flux reversals from binary data recorded on rotating disk D.

Reference voltage Vref sets a predetermined current through resistor $R_1$ by means of a feedback circuit comprising a reverse gain path and a forward gain path. The reverse gain path includes an operational transductance amplifier (OTA) g0 associated with a dominant pole. The forward gain path includes the semiconductor element Q1, resistor R1, and MR element Rmr.

The OTA g0 amplifies the difference between the voltages existing at said other end of the resistor R1 and Vref, which is referenced to the supply voltage source $+V$ as a control current at its output. This control current charges and discharges an integrating capacitor C1, creating at the base (or gate) of semiconductor element Q1 a control voltage of limited bandwidth.

This bandwidth limitation imposed on the control voltage causes a low frequency rolloff in the frequency response of the forward gain path. It also controls the low frequency (below the rolloff frequency) and direct current (dc) components of the current flowing from supply voltage source $+V$ through resistor R1, element Q1, (Q2 if used), and MR element Rmr to ground. The dc component of this limited bandwidth current is the bias current for MR element Rmr. Therefore, the magnitude of the bias current is closely determined by Vref/R1.

The gain above the low frequency rolloff of the amplifier circuit is proportional to the ratio of R1/Rmr. Capacitor C1 also serves to eliminate any noise generated by OTA g0. The dc offset at the quasi-differential output Vout will be reduced in proportion to the gain of the feedback loop. If Q1 is an NPN transistor, a feedforward current is preferably used to minimize the error associated with the feedback loop; whereas if Q1 is an NFET, a feedforward current is not needed. Further amplification of the signal present at Vout can be achieved with differential amplifiers to optimize power supply rejection ratio.

The amplifier circuit embodying the invention minimizes a low frequency error signal between Vref and the voltage at the said one end of resistor R1 for applying a predetermined bias current to a terminal of the MR element Rmr and concurrently amplifying the signal current from said MR element and applying it across resistor R1. The opposite terminal of MR element Rmr and also the conductive substrate of disk D are grounded via an optional isolation resistor Ri to minimize transient conductive asperity currents between a striped portion (not shown) of MR element Rmr and an air bearing surface of the associated disk D with protruding conductive asperities.

The amplifier circuit, as thus far described, will operate satisfactorily. However, the bias current to the MR element Rmr flows almost entirely through resistor R1. Therefore, for relatively large currents and a power supply voltage of 4.5 volts there is an upper limit to the size of resistor R1 and hence to the forward gain of the amplifier. The resistance of R1 can be increased to increase forward gain and reduce noise only if the current through it is reduced; however, this will decrease the MR bias current to an unacceptably low value due to saturation of semiconductor element Q1.

Therefore, as illustrated in FIG. 1, a second feedback circuit is included so that the amplifier circuit can concurrently provide larger MR bias currents and larger forward gain with a supply voltage +V as low as 4.5 volts by applying an extra dc current through element Q1 but not through resistor R1. This is achieved by including a cascode stage consisting of a transistor Q2 and a bias voltage source V1 so that this second feedback circuit can be added.

This second feedback circuit compares the voltage at Vref to that at the most negative terminal of resistor R2 by means of a OTA g1 (or, if preferred, the voltage at the most negative terminal of resistor R1 may be used instead of the voltage at Vref). The output of OTA g1 is filtered by an integrating capacitor C2 to eliminate frequencies in the band of interest (i.e., the data band).

A PFET device Q3 (or, if desired, a high beta PNP transistor) is preferably used to convert the control voltage generated across capacitor C1 by the output of OTA g1 into a control current through device Q3. If Q3 is a PFET, the error of the feedback loop will be nearly zero; and hence no feedforward current need be used to eliminate offset caused by limited loop gain. If Q3 is a PNP transistor, a feedforward current preferably is used to eliminate such error.

Since the current through resistor R2 is identical to that provided by device Q3 at the emitter of transistor Q2, it will be apparent that, by adjusting the value of resistor R2, an additional and predetermined low frequency dc bias current can be added to the existing bias current. Since the impedance of device Q3 as seen at the emitter of transistor Q2 is much higher than the impedance of the cascode input (at the emitter of Q2) nearly all of the alternating current (ac) signal current originating from the MR element Rmr is directed toward resistor R1. This allows all of the signal current to flow through R1 and allows R1 to have a larger resistance than possible without the second feedback circuit. Thus, the forward gain of the amplifier circuit can desirably be kept higher for lower noise performance and the bias current can be kept as high as is required by the MR element.

Figure 2:
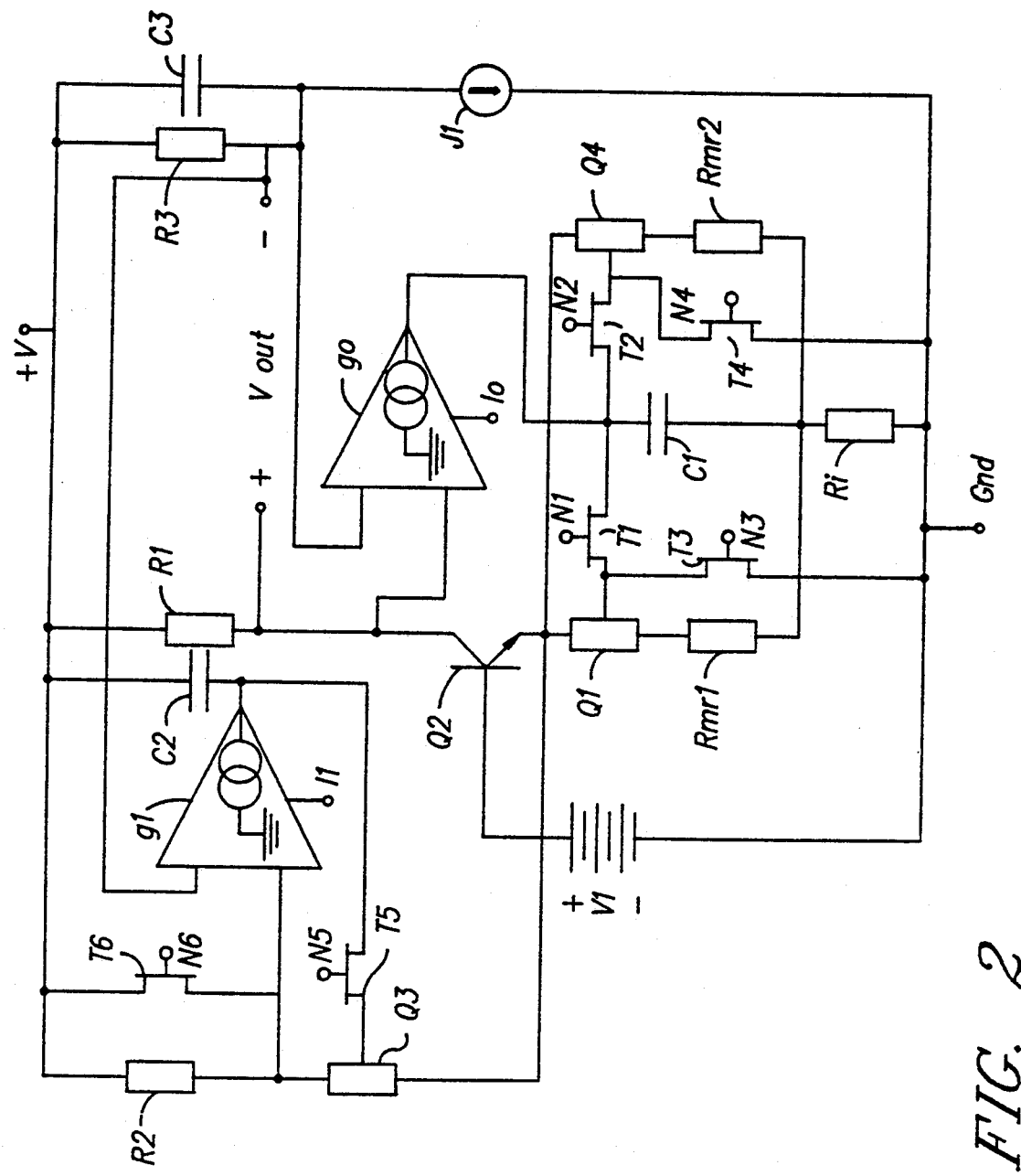
FIG. 2 is a schematic diagram of an amplifier circuit according to a modified embodiment of the invention.

FIG. 2 illustrates a modification of the amplifier circuit of FIG. 1. It is suitable for use in a disk storage system having a plurality of MR elements from which signals must be selectively read. It also is desirable for inclusion in a disk storage system using a sector servo where power saving is a requirement in a standby or an idle mode which exists between reading sectors of servo data.

More specifically, FIG. 2 illustrates how switching would be achieved in a disk storage system with two MR elements Rmr1 and Rmr2 to provide fast recovery when switching between MR elements and when switching from standby mode to either MR element, for the purpose of reading data.

The amplifier circuit of FIG. 2 consists of two input stages and an output stage. The first input stage comprises element Q1 and switching FETs T1 and T3 and services MR element Rmr1. The second input stage comprises a transistor Q4 and switching FETs T2 and T4 and services MR element Rmr2. Switching FETs T5 and T6 are included to facilitate standby mode operation only, whereas FETs T1, T2, T3, and T4 serve to facilitate both standby mode operation and switching of the MR elements. The reference voltage Vref of FIG. 1 has been replaced by a reference current source J1 and a resistor R3. A capacitor C3 is included to remove the noise in the data band caused by either J1 or R3. Source J1 is preferably constructed as a voltage-to-current converter with the voltage being either a Zener reference or a bandgap reference. If preferred, however, source J1 may be some other form of adjustable current, provided by use of a laser-trimmed resistor or a digital-to-analog converter current source trimmed by fusable links.

When a steady state condition is reached in biasing MR element Rmr1, node N1 will have caused FET T1 to connect the control terminal of element Q1 to capacitor C1, and node N3 will have caused FET T3 to disconnect the control terminal of Q1 from ground. Node N2 will have caused FET T2 to disconnect the control terminal of Q4 from capacitor C1, and node N4 will have caused FET T4 to connect the control terminal of Q4 to ground. Also, node N5 will have caused FET T5 to connect the control terminal of device Q3 to capacitor C2, and node N6 will have caused FET T6 to disconnect the control terminal of Q3 from supply voltage V.

With OTA g0 and g1 active in normal reading mode, their respective tail currents I0 and I1 will be at magnitudes appropriate for the loop bandwidths required. The term "tail current", as herein used, connotes the biasing current that controls the transconductance of the OTA.

Semiconductor element Q4, like Q1 maybe either an NPN bipolar device or an enhancement mode NFET. During switching from MR element Rmr1 to Rmr2, node N4 disconnects the control terminal of element Q4 from ground, node N1 disconnects the control terminal of Q1 from capacitor C1, node N2 connects the control terminal of Q4 to C1, and node N3 connects the control terminal of Q1 to ground.

During this switching, nodes N5 and N6 will be unaffected and the magnitude of the tail current I1 of OTA g1 and its operational status will remain unchanged. OTA g0 may experience a temporary increase in tail current I0 to facilitate a higher loop gain in the associated feedback circuit so a faster recovery can occur. The recovery rate is directly related to the time required to change the voltage across capacitor C1 from its prior value needed for MR element Rmr1 to the new value needed for MR element Rmr2. The voltage across capacitor C2 will be the same in both cases so there is no need to temporarily increase the loop gain associated with the feedback circuit that includes OTA gl.

For operation in standby mode with MR element Rmr2, a steady state condition must first be attained during read mode. Then, to save power between reading sector servo data in one sector and in the next sector, the current through MR element Rmr2 can temporarily be cut off. This is accomplished by simultaneously deactivating OTAs g0 and g1 by eliminating tail currents I0 and I1 and changing the conditions of control nodes N2, N4, N5 and N6 to accomplish the inverse function of FETs T2, T4, T5 and T6, respectively, so that where connections were formerly made there are now disconnections and where disconnections were formerly made there are now connections. This permits the voltages across the capacitors C1 and C2 to be maintained at their existing values until the next sector servo data is to be read during operation in the next read mode. The only circuitry activated and consuming power would be reference current source J1. This will maintain the voltage at capacitor C3 at the correct potential required for the next read operation. Switching from standby mode back to read mode involves reversing the process just described to switch from read mode to standby mode.

It will thus be seen that the amplifier circuits embodying the invention and as illustrated in FIGS. 1 and 2 both include an input stage, a switching means, a reference voltage and at least one feedback circuit. Also, if desired, an isolation resistor Ri maybe inserted between the common connection of each MR element and capacitor C1 to ground in order to suppress noisy ground loop currents that may exist between the amplifier circuit and grounded substrate of disk D or along the path parallel to the wiring between the amplifier circuit and MR element(s).

The cascode stage also provides a means for connecting a plurality of input stages with MR elements (such as Rmr1 and Rmr2) at the emitter of the cascode transistor Q2 to the common output stage including Q2 at the collector of Q2. As in the embodiment of FIG. 1, the embodiment of FIG. 2 may contain the optional isolation resistor Ri.

Figure 3A:
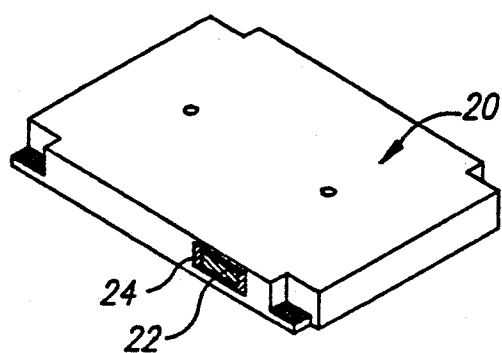
Figure 3B:
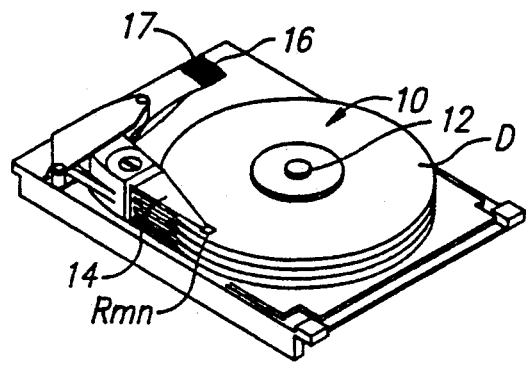
Figure 3B:
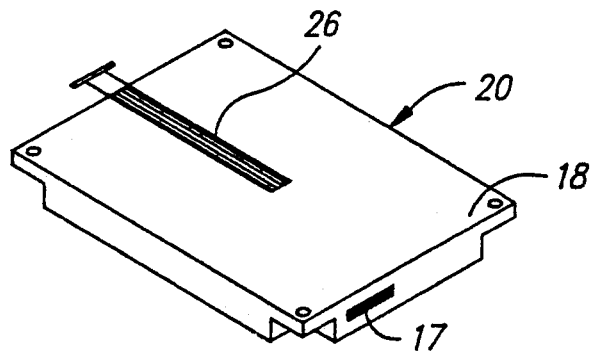

Referring now to FIGS. 3A, 3B and 3C, a head disk assembly (HDA) 10 comprises a plurality of MR elements Rmr, at least one associated with each disk D of a stack of disks rotatably mounted on a drive spindle 12, an actuator 14, an arm electronics (AE) module 16 providing flat cable leads extending from a connector 17 to the respective MR elements, and voice coil leads 18.

According to a feature of the invention, HDA 10 is completely enclosed by a highly conductive electrostatically shielded metallic disk enclosure (DE) 20. DE 20 operates as a Faraday cage to provide shielding because the single-ended input to the amplifier circuits of FIGS. 1 and 2 have no common mode rejection. DE 20 isolates leads connecting the MR elements with the amplifier circuit from large, fast rise/fall-time voltage transients. DE 20 keeps out electromagnetic interference, capacitive feedthrough of digital switching noise, spindle motor drive noise, and actuator drive noise. DE 20 is grounded (by connection to the system ground or to a 0-volt line) as close as possible to the point where the 0-volt supply line for AE module 16 enters the DE. To complete the shielding, the window 22 provided in DE 20 for servo writing is covered with a conductive film 24. The wiring to the actuator 14 and wiring 26 to the motor for drive spindle 12 should be placed outside DE 20. Thus no internal lines transmit switching signals while the amplifier circuit is reading data or servo signals from the disk.

Since the read bias current is fixed and the amplifier circuit has a low input impedance (e.g., a few ohms) and senses the signal current generated from the current biased MR element, it will be apparent that this biasing/sensing combination will provide dR/R detection, as taught in U.S. Pat. No. 4,706,138. This desirably makes the output signal Vout of the amplifier circuit relatively insensitive to variations in signal due to variations in stripe height of the MR element.

We claim:
1. A disk storage system comprising:
   at least one recording disk, each disk having a conductive substrate;
   at least one magnetoresistive (MR) element, one terminal of each MR element and the conductive substrate of each disk being grounded to minimize transient conductive asperity currents between a striped portion of each MR element and an air bearing surface of an associated disk; and
   an amplifier circuit including:
      a resistor for setting circuit gain;
      a single supply voltage source connected to one end of said resistor; and
      means providing a reference voltage source referenced to the supply voltage source;
   said amplifier circuit being operative to minimize a low frequency error signal between the reference voltage source and the voltage existing at the other end of said resistor for applying a predetermined bias current through the other terminal of each MR element and concurrently amplifying the signal current from the MR element and applying a major portion of the bias current and all the signal current across the resistor.

2. The system of claim 1, including:
   a head disk assembly (HDA) that includes each said disk and MR element; and
   a conductive electrostatically shielded enclosure that completely encloses the HDA to isolate leads connecting each MR element with the amplifier circuit from environmentally caused large, fast rise fall-time voltage transients.

3. The system of claim 1, wherein each disk is formatted with a sector servo pattern, and including means for intermittently activating and deactivating the amplifier circuit to minimize power dissipation during reading of the sector servo pattern and facilitate fast recovery response of the system upon completion of reading.

4. The system of claim 1, wherein the amplifier circuit also comprises:
   a semiconductor element having a first terminal electrically connected to said other end of the resistor, a second terminal connected to said other terminal of the MR element, and a control terminal for controlling the current flowing between said the first and second terminals;

an operational transconductance amplifier (OTA) having one input connected to the reference voltage source and another input connected to said other end of the resistor, and having an output connected to the control terminal for minimizing an error signal between the reference voltage source and the voltage existing at said other end of said resistor;

an integrating capacitor interposed between said one terminal of the MR element and control terminal to limit bandwidth of the OTA and noise; and a cascode stage comprising a transistor interposed between said other end of said resistor and said first terminal of said semiconductor element and having a control terminal connected to a bias voltage source for applying added dc current through said semiconductor element but not through the resistor.

5. The system of claim 4, wherein each disk has servo information contained in a plurality of circumferentially spaced servo sectors, and the system has a standby operational mode and a read operational mode, and said amplifier circuit includes means operative only during reading of servo information by an MR element to activate the OTA and connect the capacitor to the semiconductor means for enabling fast recovery from standby mode to read mode.

6. A circuit for simultaneously biasing and amplifying signals produced by a magnetoresistive (MR) element having two terminals, comprising:

a resistor for determining the gain of the circuit;
a single supply voltage source connected to one end of the resistor;
means providing a reference voltage source referenced to the supply voltage source;
a semiconductor element having a first terminal operatively connected to said other end of the resistor, a second terminal connected to one of said terminals of the MR element, and a control terminal for controlling the current flowing between said first and second terminals;
an operational transconductance amplifier (OTA) having one input connected to the reference voltage source and another input connected to said other end of the resistor, and having an output connected to the control terminal for minimizing an error signal between the reference voltage source and the voltage existing at said other end of said resistor;
an integrating capacitor interposed between the other terminal of the MR element and control terminal to limit bandwidth of the OTA and noise;
a cascode stage comprising a transistor interposed between said other end of said resistor and said first terminal of said semiconductor element and having a control terminal connected to a bias voltage source for applying added dc current through said semiconductor element but not through the resistor; and
means providing a return circuit to ground from said other terminal of the MR element.

7. The circuit of claim 6, wherein the semiconductor element is an NPN bipolar transistor whose collector constitutes said first terminal, emitter constitutes said second terminal and base constitutes said control terminal.

8. The circuit of claim 6, wherein the semiconductor element is an enhancement mode NFET whose drain constitutes said first terminal, source constitutes said second terminal, and gate constitutes said control terminal.

9. The circuit of claim 6, in combination with a recording disk of a storage system, said recording disk having a grounded conductive substrate for minimizing transient conductive asperity currents between a striped portion of the grounded MR element and an air bearing surface of the disk.

10. A circuit for simultaneously biasing and amplifying signals produced by a magnetoresistive (MR) element having two terminals, comprising:

a first resistor for determining the gain of the circuit;
a single supply voltage source connected to one end of said first resistor;
means providing a reference voltage source referenced to the supply voltage source;
an NPN bipolar transistor having its collector connected to the other end of said first resistor and its base connected to a biasing voltage;
a first semiconductor element having a first terminal connected to the emitter of said transistor, a second terminal connected to one terminal of the MR element, and a control terminal for controlling the current flowing between said first and second terminals;
a first operational transconductance amplifier (OTA) having one input connected to the reference voltage source and another input connected to the other end of said first resistor, and having an output connected to the control terminal for minimizing an error signal between the reference voltage source and the voltage existing at said other end of said first resistor;
a first capacitor interposed between the other terminal of the MR element and control terminal to limit bandwidth of the OTA;
means providing a return circuit to ground from said other terminal of the MR element;
a second resistor having its one end connected to the supply voltage source;
a second semiconductor element having one terminal connected to said first terminal of said first semiconductor element, another terminal connect to the other end of said second resistor, and a control terminal;
a second OTA having one input connected to the reference voltage source, another input connected to the other end of said second resistor, and an output connected to the control terminal of said second semiconductor element for minimizing an error signal between the reference voltage source and the voltage existing at said other end of said second resistor; and
a second capacitor interposed between the supply voltage source and control terminal of said second semiconductor element to limit bandwidth of said second OTA and noise.

* * * * *